(12) United States Patent
Rao

(10) Patent No.: US 7,796,458 B2
(45) Date of Patent: Sep. 14, 2010

(54) SELECTIVELY-POWERED MEMORIES

(76) Inventor: G. R. Mohan Rao, 1404 Westmont Dr., McKinney, TX (US) 75070

( * ) Notice: Subject to any disclaimer, the term of this patent is extended or adjusted under 35 U.S.C. 154(b) by 51 days.

(21) Appl. No.: 11/874,692

(22) Filed: Oct. 18, 2007

(65) Prior Publication Data
US 2009/0103386 A1 Apr. 23, 2009

(51) Int. Cl.
G11C 5/14 (2006.01)
G11C 8/00 (2006.01)
(52) U.S. Cl. ................. 365/226; 365/227; 365/228; 365/229; 365/230.03
(58) Field of Classification Search ............. 365/226, 365/227, 228, 229, 203, 230.03
See application file for complete search history.

(56) References Cited

U.S. PATENT DOCUMENTS

| 3,703,710 | A | | 11/1972 | Kubo et al. | |
| 5,615,162 | A | * | 3/1997 | Houston | 365/226 |
| 6,151,262 | A | * | 11/2000 | Haroun et al. | 365/227 |
| 6,343,036 | B1 | * | 1/2002 | Park et al. | 365/203 |
| 6,442,667 | B1 | * | 8/2002 | Shiell et al. | 365/230.03 |
| 7,443,759 | B1 | * | 10/2008 | Rowlands et al. | 365/226 |

FOREIGN PATENT DOCUMENTS

EP 0284276 A2 9/1988

OTHER PUBLICATIONS

MICRON; 512Mb: x4, x8, x16 DDR2 SDRAM Features; pp. 1-133; Micron Technologies, Inc.; 2004.
Jedec; Double Data Rate (DDR) SDRAM Specification; pp. 1-85; JEDEC Solid State Technology Association 2005.
International Search Report and Written Opinion mailed Feb. 2, 2009 for PCT/US2008/079418.
International Preliminary Report on Patentability, issued in International Patent Application No. PCT/US2008/079418, mailed Apr. 29, 2010, 7 pages.

* cited by examiner

Primary Examiner—Trong Phan
(74) Attorney, Agent, or Firm—Schwabe, Williamson & Wyatt, P.C.

(57) ABSTRACT

Embodiments provide methods, apparatuses and systems including a plurality of memory cells configured to store bit values while being powered at a power-saving voltage lower than a normal-operation voltage during operation of a host apparatus, and power circuitry coupled to the plurality of memory cells. The power circuitry is configured to selectively power a first subset of the plurality of memory cells at the normal-operation voltage during operation of the host apparatus while concurrently powering a second subset of the plurality of memory cells at the power-saving voltage. The first and second subsets being different subsets of the memory cells.

26 Claims, 4 Drawing Sheets

SELECTIVELY-POWERED MEMORIES

TECHNICAL FIELD

Embodiments of the present invention relate to the field of integrated circuits, and, more specifically, to digital memory apparatuses, systems, and methods for selectively-powering memory cells.

BACKGROUND

Central processing units (CPU) often include one or more levels of embedded cache memory. These cache memories duplicate frequently-accessed data stored in main-memory thereby speeding memory access time. As computing power increases, so does the size of CPU cache. But access speeds suffer as memory cache size increases. Often, processor cache architectures utilize static random access memory (SRAM) cells.

In mobile devices and other applications, conserving power is important. One currently-known conservation method places the device into a standby-mode. While in standby-mode, SRAM can be brought into a low-power mode sustained by a voltage level lower than a normal-operation voltage without losing stored data bits. When the SRAM is subsequently accessed, it is brought back up to a normal-power mode.

BRIEF DESCRIPTION OF THE DRAWINGS

Embodiments of the present invention will be readily understood by the following detailed description in conjunction with the accompanying drawings. Embodiments of the invention are illustrated by way of example and not by way of limitation in the figures of the accompanying drawings.

DETAILED DESCRIPTION OF EMBODIMENTS

Figure 1:
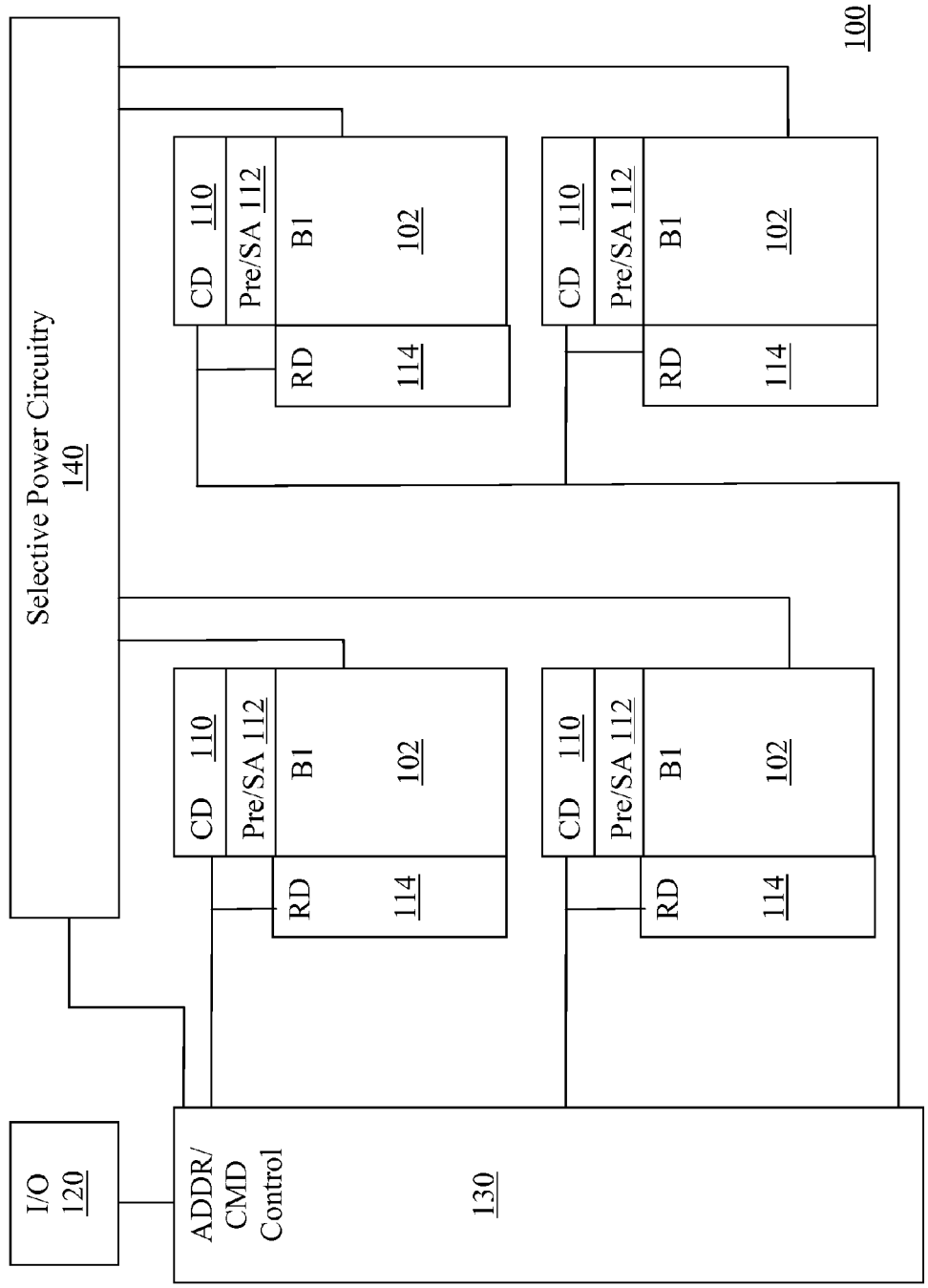
FIG. 1 illustrates a selectively-powered memory device in accordance with various embodiments.

In the following detailed description, reference is made to the accompanying drawings which form a part hereof, and in which are shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Also, embodiments may have fewer operations than described. A description of multiple discrete operations should not be construed to imply that all operations are necessary.

The description may use perspective-based descriptions such as up/down, back/front, and top/bottom. Such descriptions are merely used to facilitate the discussion and are not intended to restrict the application of embodiments of the present invention.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments may include an apparatus comprising a plurality of memory cells configured to store bit values while being powered at a power-saving voltage lower than a normal-operation voltage. Embodiments may include power circuitry coupled to the plurality of memory cells and configured to selectively power a first subset of the plurality of memory cells at the normal-operation voltage, while concurrently powering a second subset of the plurality of memory cells at the power-saving voltage, the first and second subsets being different subsets of the memory cells.

In embodiments, the first subset may be selected from a group consisting of a bank of memory cells, a sub-bank of memory cells smaller than a bank, an array of memory cells, a sub-array of memory cells smaller than an array of memory cells, a row of memory cells, and a single memory cell. Embodiments may include access circuitry coupled to the plurality of memory cells and configured to perform access operations on the plurality of memory cells. In embodiments, the power circuitry may be further configured to perform said selective powering while the access circuitry performs an access or precharge operation on a third subset of the plurality of memory cells, the first subset comprising the third subset. In embodiments, the first subset may a superset of the third subset.

Embodiments may include precharge circuitry coupled to the access circuitry and configured to selectively precharge one or more bit lines corresponding to the third subset while the power circuitry is performing said selective powering. In embodiments, the precharge circuitry may be configured to precharge at a granularity level less than a bank of memory cells.

In embodiments, the plurality of memory cells may be static random access memory (SRAM) cells. Embodiments may include a processor having a processor cache comprising the plurality of memory cells.

Embodiments may include an article of manufacture comprising a plurality of computer readable hardware design language or compilation of the hardware design language. In embodiments, the hardware design language may specify an implementation of an apparatus, in accordance with embodiments, as an integrated circuit. In embodiments, the hardware design language may be either VHDL or Verilog, or other design languages.

FIG. 1 illustrates a selectively-powered memory device 100 in accordance with various embodiments. Memory device 100 may include four memory banks (B1) 102. Memory banks 102 may each include a plurality of memory cells configured to store bit values while being powered at a power-saving voltage lower than a normal-operation voltage. In embodiments, memory device 100 may be configured to access the memory cells only while the memory cells are powered at the normal-operation voltage. In embodiments, the normal-operation voltage may be a range of voltages over which the memory cells may be accessed. In embodiments, the power-saving voltage may be a range of voltages over which a memory cell may store bit values.

In alternate embodiments, memory device 100 may include fewer or more memory banks; embodiments may include devices with only a single memory bank. Embodiments may include memory devices that comprise less than a single memory bank. As such, FIG. 1 is exemplary only, and embodiments are not limited to the device depicted in FIG. 1.

Each of memory banks 102 may include column decoder 110, sense amplifier and selective precharge circuit (Pre/SA) 112, and row decoder 114. Memory device 100 may also include I/O circuit 120 configured to receive access commands, addresses, and data from an external component such as for example a memory controller or CPU component, and to send data to such an external component. I/O circuit 120 may be coupled to address command/and control circuit 130. Address command and control circuit 130 may be configured to receive, from I/O circuit 120, an address corresponding to a particular one or more of memory cells of memory banks 102 and a corresponding command to perform an access operation on the particular one or more of the memory cells. The received address may comprise a row portion and a column portion corresponding to the memory cells to be accessed. In embodiments, the received address may correspond to a single memory cell. Address command and control circuit 130 may be configured to pass the row portion of the received address to the appropriate one of row decoder(s) 114 and the column portion to the appropriate one of column decoder(s) 110 which may be configured to decode the received row and column portions, respectively. In embodiments, the row portion may include a bank address portion, which may be used to route the row and column portions to the decoders of an appropriate one of banks 102. In such embodiments, memory device 100 may be pseudo-static SRAM which may utilize a DRAM-type-matrix while operating functionally as a standard SRAM device.

Sense amplifier and precharge circuit 112 may be configured to precharge a plurality of bit lines corresponding to the memory cells to be accessed. Row decoder 114 may activate row lines corresponding to the memory cells to be accessed and column decoder 110 in conjunction with precharge and sense amplifier circuit 112 may act to either read or write data to the memory cells corresponding to the memory cells to be accessed. In other embodiments where the access command is a precharge command, no read or write operation may be performed.

Selective-power circuit 140 may be coupled to address command and control circuit 130. Selective-power circuit 140 may be configured to selectively power, in embodiments, one or more of banks 102 at a normal-operation voltage while at the same time selectively power other of banks 102 at a power-saving voltage. In embodiments, selective-power circuit 140 may be configured to selectively power a first subset of memory cells at a normal-operation voltage, the first subset including less than all of the memory cells that comprise any of banks 102. In embodiments, selective-power circuit 140 may be configured to selectively power a second subset at a power-saving voltage while concurrently selectively powering the first subset at the normal-operation voltage. In embodiments, the second subset may include three of banks 102. In embodiments, the second subset may include three of banks 102 as well as some, but not all, of memory cells in the remaining bank. The first subset of memory cells, as used herein, may refer to an entire bank of memory cells or larger group of memory cells.

In embodiments, selective-power circuit 140 may be configured to selectively power the first subset of memory cells at a normal-operation voltage when a command is received to access a third subset of memory cells, the first subset including the third subset. In embodiments, the first subset may be a superset of the third. In embodiments the first and third subsets may be the same. In embodiments, address command and control circuit 130 may be configured to signal selective-power circuit 140 to selectively power the memory cells contained within memory banks 102 based on the received access command. In embodiments, address command and control circuit 130 may be configured to pass some or all of the received address to selective-power circuit 140 which may be configured to decode the received address and selectively power the memory cells based on the decode.

In embodiments, selective power circuit 140 may be configured to bring a first subset of memory cells up to a normal-operation voltage from a power-saving voltage upon receipt of an address corresponding to the first subset of memory cells. In such embodiments, selective power circuit 140 may be configured to continue powering some or all of the remaining memory cells at a power-saving voltage while powering the first subset in a normal-operation voltage.

In embodiments, selective-power circuit 140 may be configured to bring the voltage of any of memory cells of memory banks 102 down to a power-saving voltage. In embodiments, such powering down may occur due to inactivity of the memory cells. In embodiments, such inactivity may be measured by an inactivity timer. In alternate embodiments, such inactivity may predicted using a history of accesses, a pattern of accesses, or other technique(s). In embodiments, selective-power circuit 140 and/or memory device 100 may receive a command to power down some or all of the memory cells of memory banks 102 at either a power-saving voltage or a normal-operation voltage, In embodiments, selective-power circuit 140 may be configured to power some memory cells at a normal operation voltage even though they are not currently being accessed. As an example only, if selective-power circuit 140 powers three of banks 102, at a power-saving voltage and a fourth of banks 102 at a normal-operation voltage, and a command is then received to access memory cells within a selected one of the three power-saving voltage banks 102, selective-power circuit 140 may be configured to power the selected one of the three power-saving voltage banks at the normal-operation voltage. Selective-power circuit 140 may also be configured, in this example, to maintain the fourth of banks 102 at the normal-operation voltage, and to maintain the remaining banks at the power-saving voltage.

In embodiments, memory device 100 may be included within a central processing unit (CPU). In embodiments, the memory cells of memory banks 102 may be static random access memory (SRAM) cells. In embodiments, memory device 100 may comprise processor cache such as, for example, L1, L2, or L3 cache.

In embodiments, sense amplifier and precharge circuit 112 may be configured to precharge bit lines associated with the memory cells to be accessed. In embodiments, sense amplifier and precharge circuit 112 may be configured to precharge at a granularity less than a memory bank. In embodiments, an entire memory bank of memory cells may be precharged.

Figure 2:
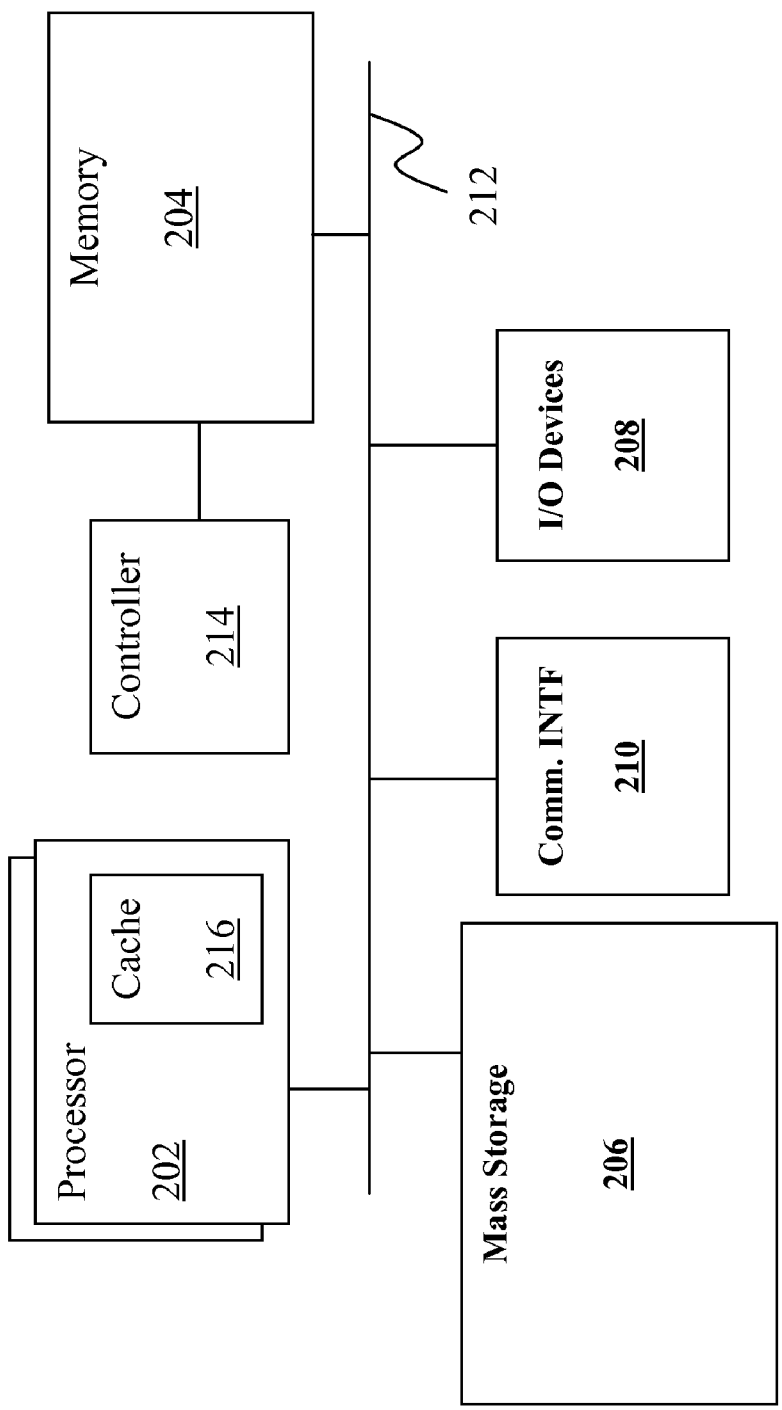
FIG. 2 illustrates a computing system suitable for use to practice various embodiments.

FIG. 2 illustrates a computing system 200 suitable for use to practice various embodiments as described herein. As shown, computing system/device 200 may include one or more processors 202, and system memory 204. Additionally, computing system/device 200 may include mass storage devices 206 (such as diskette, hard drive, CDROM, flash memory, and so forth), input/output devices 208 (such as keyboard, cursor control and so forth) and communication interfaces (Comm. INTF) 210 (such as network interface cards, modems and so forth). The elements may be coupled to each other via system bus 212, which represents one or more buses. In the case of multiple buses, they may be bridged by one or more bus bridges (not shown). Finally, controller 214 may be included and configured to operate memory 204.

In embodiments, one or more processors 202 may include memory cache 216 embodied with one or more of the teachings of the present invention. In embodiments, memory cache 216 may be memory device 100 of FIG. 1. Memory cache 216 may be, in embodiments L3 cache or other processor cache. In embodiments, memory cache 216 may be configured to duplicate the contents of system memory 204. In embodiments, memory cache 216 may be SRAM cache.

Other than the teachings of the various embodiments of the present invention, each of the elements of computer system/device 200 may perform its conventional functions known in the art. In particular, system memory 204 and mass storage 206 may be employed to store a working copy and a permanent copy of programming instructions implementing one or more software applications.

Although FIG. 2 depicts a computer system, one of ordinary skill in the art will recognize that embodiments of the present invention may be practiced using other devices that utilize SRAM or other types of digital memory such as, but not limited to, mobile telephones, Personal Data Assistants (PDAs), gaming devices, high-definition television (HDTV) devices, appliances, networking devices, digital music players, laptop computers, portable electronic devices, telephones, as well as other devices known in the art. Such devices may be, in embodiments, system-on-chip devices.

Figure 3:
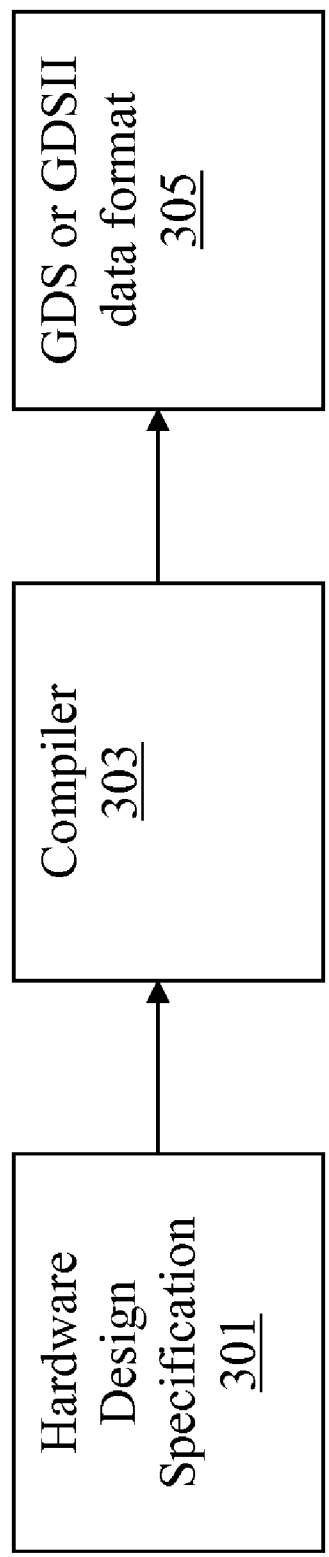
FIG. 3 shows a block diagram of a hardware design specification being compiled into GDS or GDSII data format in accordance with various embodiments.

In various embodiments, the earlier-described memory cells are embodied in an integrated-circuit. Such an integrated-circuit may be described using any one of a number of hardware-design-languages, such as but not limited to VHSIC hardware-description-language (VHDL) or Verilog. The compiled design may be stored in any one of a number of data format, such as but not limited to GDS or GDS II. The source and/or compiled design may be stored on any one of a number of medium such as but not limited to DVD. FIG. 3 shows a block diagram depicting the compilation of a hardware design specification 301 which may be run through compiler 303 producing GDS or DGSII data format 305 describing an integrated circuit in accordance with various embodiments.

Figure 4:
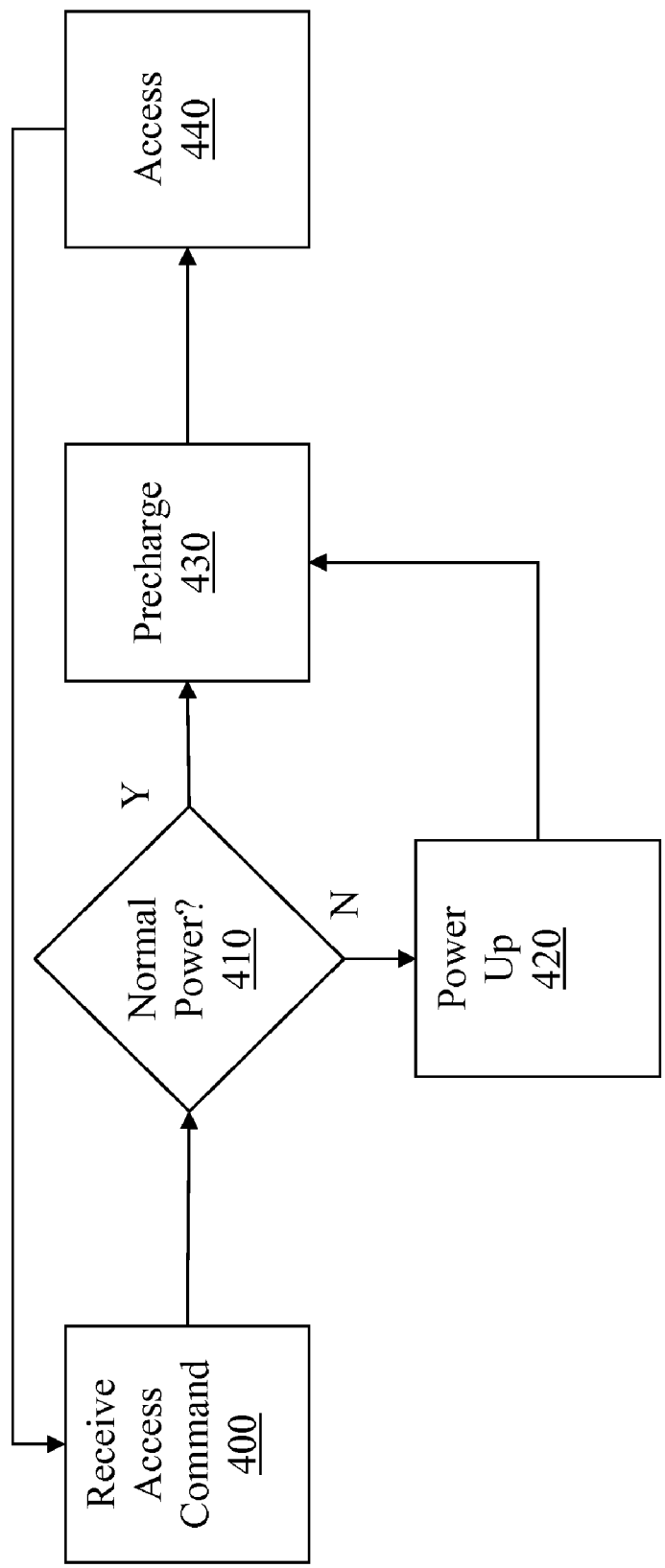
FIG. 4 illustrates a method of operating a selectively-powered memory device in accordance with various embodiments.

FIG. 4 illustrates a method of operating a selectively-powered memory device in accordance with various embodiments. A memory device, such as device 100 of FIG. 1, may be configured to receive an access command to perform an access operation on a set of memory cells at block 400. The device may then determine if the set of memory cells are currently being powered at a normal-operation voltage at 410. If not, then the device may bring up their voltage levels to power them at a normal-operation voltage at 420. Once the memory cells are operating at a normal-operation voltage, or if they are already so operating, the device may precharge bit lines associated with the set of memory cells to be accessed at block 430. In embodiments, such precharging may occur at a granularity level less than a memory bank. Once precharging has occurred, the device may perform the access operation on the memory cells 440. In embodiments, the access operation may be a read or write command. In embodiments, the access operation may be a precharge, in which case no further operations may be performed on the memory cells until another command is received.

In embodiments, some or all memory cells of a memory device may be powered down to a power-saving voltage after being accessed or after another event. In embodiments, if no memory cells of a group of memory cells have been accessed after a period of time, the memory device may power down the group of memory cells. In embodiments, the memory device or other device connected to the memory device may predict whether a group of memory cells will be idle based on a history of accesses or other technique and, if so, bring them down to a power-saving voltage. Such a group of memory cells may be a bank, array, sub-bank, sub-array, data word, or single memory cell. In embodiments, powering-down to a power-saving voltage may occur at the same granularity that selective-powering brings the voltage levels up to a normal-operation voltage. In embodiments, powering up and powering down of memory cells may occur at different granularity levels. In embodiments, the memory device may receive a command to power down memory cells before doing so.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus, comprising:
   circuitry configured to selectively power one or more of a first subset of a plurality of memory cells or a second subset of the plurality of memory cells, different than the first subset, at a normal-operation voltage, or at a power-saving voltage; wherein:
   the circuitry is configured to determine, in response to receipt of an access command to perform an access operation on one or more memory cells of the first subset, whether a voltage level of the first subset is at the power-saving voltage, and
   the circuitry is configured to cause the voltage level of the first subset to change to the normal-operation voltage if the voltage level of the first subset is determined to be at the power-saving voltage.

2. The apparatus of claim 1, wherein the first subset is selected from a group consisting of a bank of memory cells, a sub-bank of memory cells smaller than a bank, an array of memory cells, a sub-array of memory cells smaller than an array of memory cells, a row of memory cells, and a single memory cell.

3. The apparatus of claim 1, further comprising access circuitry coupled to the plurality of memory cells and configured to perform the access operation on the one or more memory cells of the first subset, and wherein the circuitry is further configured to selectively power the first subset at least while the access circuitry performs the access operation.

4. The apparatus of claim 3, wherein the first subset comprises more memory cells than the one or more memory cells.

5. The apparatus of claim 1, wherein the plurality of memory cells comprises static random access memory (SRAM) cells.

6. The apparatus of claim 1, wherein the apparatus comprises a processor including a processor cache comprising the plurality of memory cells.

7. The apparatus of claim 1, further comprising the plurality of memory cells coupled to the circuitry, wherein the memory cells are configured to store bit values while powered at the power-saving voltage.

8. A method, comprising:
providing power to a first subset of a plurality of memory cells at a power-saving voltage or a normal operation voltage, wherein the power-saving voltage is lower than a normal-operation voltage;
determining, in response to receipt of an access command to perform an access operation on one or more memory cells of the first subset, whether a voltage level of the first subset is at the power-saving voltage; and
changing the voltage level of the first subset to the normal-operation voltage in response to determining that the voltage level of the first subset is at the power-saving voltage.

9. The method of claim 8, further comprising performing, by access circuitry, the access operation on the one or more memory cells.

10. The method of claim 9, wherein the first subset comprises more memory cells than the one or more memory cells.

11. The method of claim 8, wherein the first subset is selected from a group consisting of a bank of memory cells, a sub-bank of memory cells smaller than a bank, an array of memory cells, a sub-array of memory cells smaller than an array of memory cells, a row of memory cells, and a single memory cell.

12. A system, comprising:
a system memory device; and
a central processing unit coupled to the system memory device, the central processing unit (CPU) including a memory cache, wherein the memory cache includes:
a plurality of memory cells; and
power circuitry coupled to the plurality of memory cells and configured to:
determine, in response to receipt of an access command to perform an access operation on one or more memory cells of a first subset of the plurality of memory cells, whether a voltage level of the first subset is at a power-saving voltage; and
change the voltage level to a normal-operation voltage in response to a determination that the voltage level is at the power-saving voltage.

13. The system of claim 12, wherein the memory cache further comprises access circuitry coupled to the plurality of memory cells and configured to perform the access operation on the one or more memory cells of the first subset, and wherein the power circuitry is further configured to selectively power the second subset at the power-saving voltage during a time that the access circuitry performs the access operation on the one or more memory cells of the first subset.

14. The system of claim 13, wherein the first subset comprises more memory cells than the one or more memory cells.

15. The system of claim 12 wherein the plurality of memory cells comprises static random access memory (SRAM) cells.

16. The system of claim 12, wherein the circuitry is configured to selectively power, during operation of the CPU, the first subset of the plurality of memory cells at the normal-operation voltage, and concurrently power a second subset of the plurality of memory cells at the power-saving voltage.

17. An apparatus, comprising:
means for determining whether a voltage level of a first subset of a plurality of memory cells is at a power-saving voltage and, if the voltage level is at the power-saving voltage, for selectively powering the first subset at a normal-operation voltage, wherein the power-saving voltage is lower than a normal-operation voltage; and
means for performing an access operation on the one or more memory cells of the first subset; and
wherein the means for determining further includes means for selectively powering a second subset at the power-saving voltage while the means for performing access operations performs access operations on the one or more memory cells.

18. The apparatus of claim 17, wherein the first subset comprises more memory cells than the one or more memory cells.

19. An article of manufacture, comprising a plurality of computer-readable hardware design language instructions, or compilation of the hardware design language instructions, wherein the hardware design language instructions specify an implementation of the apparatus as set forth in claim 1 as an integrated circuit.

20. The article of manufacture of claim 19, wherein a hardware design language of the hardware design language instructions is either VHDL or Verilog.

21. An apparatus, comprising:
circuitry configured to selectively power one or more of a first subset of a plurality of memory cells or a second subset of the plurality of memory cells, different than the first subset, at a normal-operation voltage, or at a power-saving voltage; wherein:
the circuitry is configured to determine, in response to receipt of an access command to perform an access operation on one or more memory cells of the first subset, which of the one or more memory cells is powered at the power-saving voltage, and
the circuitry is configured to cause the voltage levels of the one or more memory cells determined to be powered at the power-saving voltage to be powered at the normal-operation voltage.

22. The apparatus of claim 21, wherein the first subset is selected from a group consisting of a bank of memory cells, a sub-bank of memory cells smaller than a bank, an array of memory cells, a sub-array of memory cells smaller than an array of memory cells, a row of memory cells, and a single memory cell.

23. The apparatus of claim 21, further comprising access circuitry coupled to the plurality of memory cells and configured to perform the access operation on the one or more memory cells of the first subset.

24. The apparatus of claim 23, wherein the first subset comprises more memory cells than the one or more memory cells.

25. The apparatus of claim 21, wherein the apparatus comprises a processor including a processor cache having a plurality of memory cells.

26. The apparatus of claim 21, further comprising the plurality of memory cells coupled to the circuitry, wherein the memory cells are configured to store bit values while powered at the power-saving voltage.

* * * * *